(12) United States Patent
Cook

(10) Patent No.: US 12,159,091 B2
(45) Date of Patent: *Dec. 3, 2024

(54) APPARATUS AND METHOD FOR MULTI-STAGE FRACKING

(71) Applicant: David Cook, Lakeway, TX (US)

(72) Inventor: David Cook, Lakeway, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/405,465

(22) Filed: Jan. 5, 2024

(65) Prior Publication Data

US 2024/0160816 A1    May 16, 2024

Related U.S. Application Data

(63) Continuation of application No. 17/986,474, filed on Nov. 14, 2022, now Pat. No. 11,880,639.

(60) Provisional application No. 63/409,428, filed on Sep. 23, 2022.

(51) Int. Cl.
*G06F 30/28* (2020.01)

(52) U.S. Cl.
CPC .................... *G06F 30/28* (2020.01)

(58) Field of Classification Search
CPC .......................................... G06F 30/28
See application file for complete search history.

(56) References Cited

U.S. PATENT DOCUMENTS

| 10,711,604 B2 | 7/2020 | Johnson |
| 11,373,058 B2 | 6/2022 | Jaaskelainen |
| 2020/0089650 A1* | 3/2020 | Sharma ............... G06N 20/00 |
| 2021/0332683 A1* | 10/2021 | Hunter ............... E21B 43/261 |
| 2022/0112796 A1 | 4/2022 | Jaaskelainen |
| 2022/0145742 A1 | 5/2022 | Dalamarinis |
| 2022/0243568 A1 | 8/2022 | Altammar |

FOREIGN PATENT DOCUMENTS

WO    WO-2021016212 A1 *   1/2021   ............ E21B 43/26

* cited by examiner

*Primary Examiner* — Steven W Crabb
(74) *Attorney, Agent, or Firm* — Caldwell Intellectual Property Law

(57) ABSTRACT

An apparatus for multi-stage fracking, wherein the apparatus includes a pump configured to pump a fracking fluid into a rock region comprises a plurality of rock zones, and a computing device communicatively connected to the pump, wherein the computing device includes at least a processor, and a memory communicatively connected to the at least a processor containing instructions configuring the at least a processor to receive reservoir data, determine an optimal fracking stimulation parameter as a function of the reservoir data, identify a fracking stage as a function of the optimal fracking stimulation parameter, and adjust a pump configuration of the pump as a function of the fracking stage.

18 Claims, 7 Drawing Sheets

APPARATUS AND METHOD FOR MULTI-STAGE FRACKING

CROSS-REFERENCE TO RELATED APPLICATIONS

This application is a continuation of Non-provisional application Ser. No. 17/986,474, U.S. Pat. No. 11,880,639, filed on Nov. 14, 2022, and entitled "AN APPARATUS AND METHOD FOR MULTI-STAGE FRACKING," the entirety of which claims the benefit of priority of U.S. Provisional Patent Application Ser. No. 63/409,428, filed on Sep. 23, 2022, and titled "MULTISTAGE FRACTURING TECHNIQUE GUIDED BY AI" both of which are incorporated herein by reference in their entirety.

FIELD OF THE INVENTION

The present invention generally relates to the field of natural resource extraction. In particular, the present invention is directed to an apparatus and method for multi-stage fracking.

BACKGROUND

There are significant differences in natural resource production after large-scale fracking of horizontal wells due to a plurality of reservoir properties. Fracking optimization is very important for low permeability reservoir stimulation and development in natural resource extraction. A solution to optimize the fracking process by multi-stage fracking is needed to maximize natural resource production. Existing solutions are not satisfactory.

SUMMARY OF THE DISCLOSURE

In an aspect, an apparatus for multi-stage fracking is disclosed. The apparatus includes a pump comprising one or more valves, wherein the pump is configured to pump a fracking fluid into a rock region comprising a plurality discreate fracture networks on a pump configuration. The apparatus includes a computing device communicatively connected to the pump, wherein the computing device comprises at least a processor and a memory communicatively connected to the at least a processor. The memory instructs the at least a processor to receive a first set of reservoir data from a first set sensing devices located on the surface of a target well. The memory instructs the at least a processor to determine an optimal fracking stimulation parameter as a function of the first set of reservoir data using a fracking optimization machine-learning model. The memory instructs the at least a processor to identify a fracking stage as a function of the optimal fracking stimulation parameter. The memory instructs the at least a processor to adjust the pump configuration of the pump as a function of the fracking stage. Wherein one or more valves are actuated to control a release of the fracking fluid as a function of the pump configuration. The memory instructs the at least a processor to receive a second set of reservoir data using a second set of sensing devices based on the actuation of the one or more valves, wherein the second set of reservoir data is associated with effect of actuation of the one or more valves on the rock region. The memory instructs the at least a processor to update the optimal fracking stimulation parameter as a function of the second set of reservoir data.

In another aspect, a method for multi-stage fracking is also disclosed. The method includes pumping, using a pump comprising one or more valves, a fracking fluid into a rock region comprising a plurality discreate fracture networks on a pump configuration. The method includes receiving, using at least a processor, a first set of reservoir data from a first set sensing devices located on the surface of a target well. The method includes determining, using the at least a processor, an optimal fracking stimulation parameter as a function of the first set of reservoir data using a fracking optimization machine-learning model. The method includes identifying, using the at least a processor, a fracking stage as a function of the optimal fracking stimulation parameter. The method includes adjusting, using the at least a processor, the pump configuration of the pump as a function of the fracking stage. The method includes actuating, using the pump, the one or more valves to control a release of the fracking fluid as a function of the pump configuration. The method includes receiving, using at least a processor, a second set of reservoir data using a second set of sensing devices based on the actuation of the one or more valves, wherein the second set of reservoir data is associated with effect of actuation of the one or more valves on the rock region. The method includes updating, using at least a processor, the optimal fracking stimulation parameter as a function of the second set of reservoir data.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations, and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for multi-stage fracking, wherein the apparatus includes a pump configured to pump a fracking fluid into a rock region comprises a plurality of rock zones, and a computing device communicatively connected to the pump, wherein the computing device includes at least a processor, and a memory communicatively connected to the at least a processor containing instructions configuring the at least a processor to receive reservoir data, determine an optimal fracking stimulation parameter as a function of the reservoir data, identify a fracking stage as a function of the optimal fracking stimulation parameter, and adjust a pump configuration of the pump as a function of the fracking stage.

In an embodiment, methods and apparatus described herein may perform or implement one or more aspects of fracking (i.e., frac). As used in this disclosure, "fracking," also known as hydraulic fracking, is a small method of a broader process of unconventional development of underground natural resources, such as, without limitation, oil, natural gas, and the like thereof. In some embodiments, fracking may fracture bedrock formations using pressurized liquid. In a non-limiting example, fracking process may include injecting a high-pressure fracking fluid through a wellbore to create cracks in bedrock formations. As used in this disclosure, a "fracking fluid" is a chemical mixture used in drilling operations to increase the quantity of hydrocarbons that can be extracted. Fracking fluid may primarily contain water. In some cases, fracking fluid may include one or more proppants. As used in this disclosure, a "proppant" is a solid material designed to keep an induced fracture open during fracking. In some cases, proppant may include sand, treated sand, man-made ceramic material, and the like thereof. When fracking fluid is removed from the well, small grains of proppant, such as, without limitation, sand, aluminum oxide, and/or the like may hold induced fractures open. Natural resources such as, without limitation, natural gas, petroleum, brine, and the like may flow more freely through induced fractures.

Figure 1:
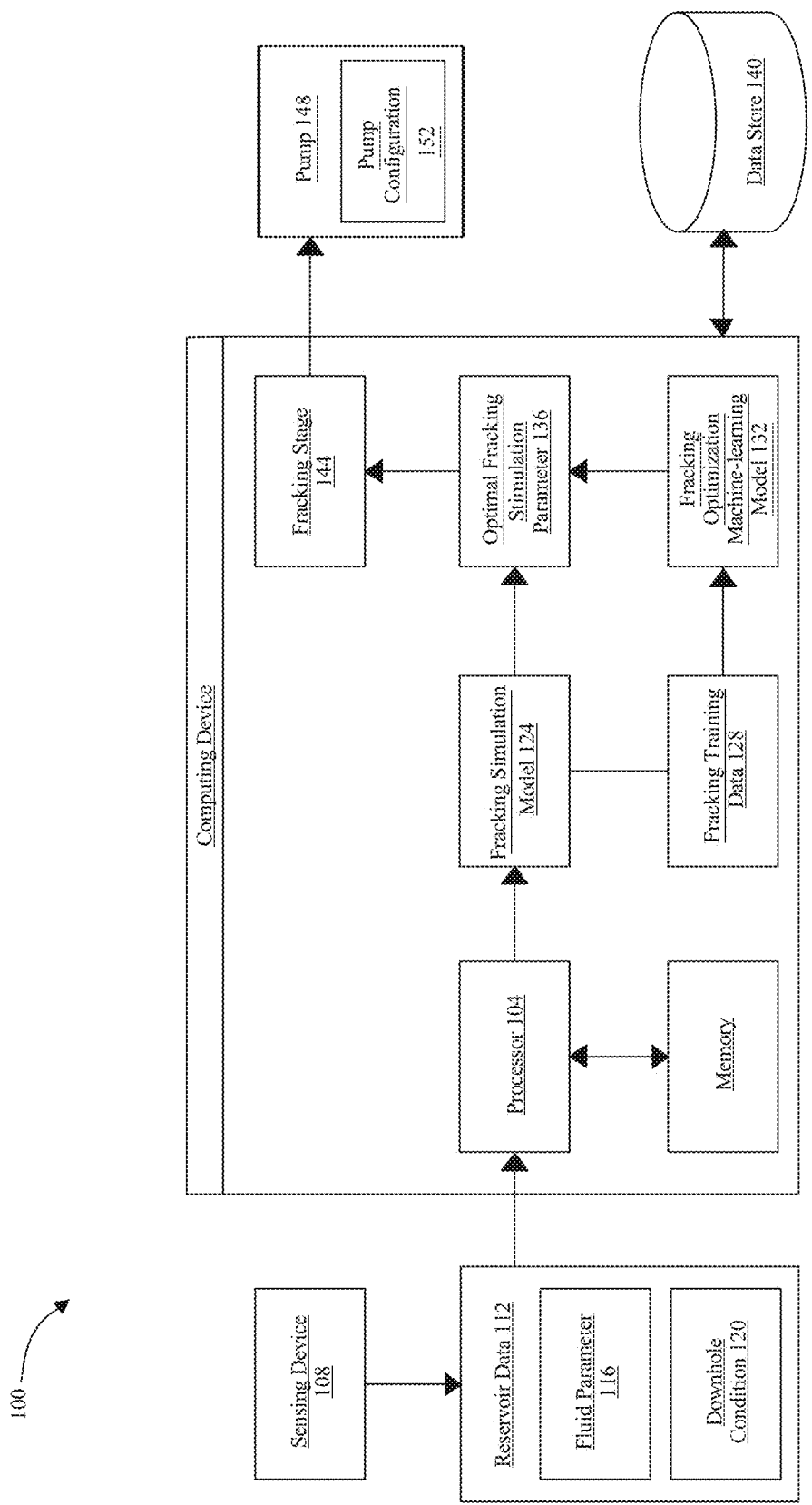
FIG. 1 is a block diagram of an exemplary embodiment of an apparatus for multi-stage fracking.

Referring now to FIG. 1, an exemplary embodiment of an apparatus 100 for multi-stage fracking is illustrated. Apparatus 100 includes a pump 148. In some cases, pump 148 may include a substantially constant pressure pump (e.g., centrifugal pump) or a substantially constant flow pump (e.g., positive displacement pump, gear pump, and the like). Pump 148 can be hydrostatic or hydrodynamic. As used in this disclosure, a "pump" is a mechanical source of power that converts mechanical power into fluidic energy. In some embodiments, pump 148 may generate flow with enough power to overcome pressure induced by a load at a pump outlet. In some embodiments, pump 148 may generate a vacuum at a pump inlet, thereby forcing fluid from a reservoir into pump inlet to pump 148 and by mechanical action delivering this fluid to pump outlet. Hydrostatic pumps are positive displacement pumps. In some embodiments, hydrostatic pumps may include reciprocating positive displacement pumps. Hydrodynamic pumps can be fixed displacement pumps, in which displacement may not be adjusted, or variable displacement pumps, in which the displacement may be adjusted. Exemplary non-limiting pumps include gear pumps, rotary vane pumps, screw pumps, bent axis pumps, inline axial piston pumps, radial piston pumps, and the like. Pump 148 may be powered by any rotational mechanical work source, for example without limitation and electric motor or a power take off from an engine. Pump 148 may be in fluidic communication with at least a reservoir. In some cases, reservoir may be unpressurized and/or vented. Alternatively, reservoir may be pressurized and/or sealed.

With continued reference to FIG. 1, pump 148 may include a valve. As used in this disclosure, a "valve" is a component that controls fluidic communication between two or more components. Exemplary non-limiting valves include directional valves, control valves, selector valves, multi-port valves, check valves, and the like. Valves may include any suitable valve construction including ball valves, butterfly valves, needle valves, globe valves, gate valves, wafer valves, regulator valves, and the like. Valves may be included in a manifold of hydraulic or pneumatic circuit, for example allowing for multiple ports and flow paths. Valves may be actuated by any known method, such as without limitation by way of hydraulic, pneumatic, mechanical, or electrical energy. For instance, in some cases, a valve may be actuated by an energized solenoid or electric motor. Valve actuators and thereby valves themselves, may be controlled by computing device described below in this disclosure. Computing device may be in communication with valve, for example by way of one or more of electrical communication, hydraulic communication, pneumatic communication, mechanical communication, and the like. In some cases, computing device may be in communication with one or more components (e.g., valve, pump 148, sensing device 108, and the like) by way of one or more networks, including for example wireless networks and controller area networks (CANs).

With continued reference to FIG. 1, pump 148 is configured to pump fracking fluid into a rock region includes a plurality of rock zones. Fracking fluid may be any fracking fluid described in this disclosure. As used in this disclosure, a "rock region" is a region of a reservoir. As used in this disclosure, a "reservoir" is a formation of rock in which natural resources has accumulated. In a non-limiting example, rock region may be a region of formation of rock where fracking stimulation is performed. In some cases, natural resources may include geothermal energy. As used in this disclosure, a "rock zone" is a smaller region within rock region described above. In a non-limiting example, pumping fracking fluid may include creating a discrete fracture network in rock region. As used in this disclosure, a "discrete fracture network" is a plurality of fractures that is represented as a network. Each fracture of plurality of fractures may include one or more geometrical properties such as, without limitation, orientation, size, position, shape, aperture, and the like thereof. In a non-limiting example, a discrete fracture network may include a topological relationship such as, without limitation, connectivity, adjacency, enclosure, and the like between each individual fracture and/or fracture sets within plurality of fractures in the discrete fracture network. Rock region may include a plurality of rock zones, wherein each rock zone may include one or more fractures/fracture sets. Pumping fracking fluid may further include isolating a previous rock region, wherein the previous rock region is rock region being analyzed and/or fractured. Previous rock region may be adjacent to rock region which fracking fluid is being pumped. In some embodiments, isolating the previous rock region may include a usage of mechanical isolation. Mechanical isolation may be provided by technology such as, without limitation, plug and perf, coil sleeves, open hole packers, ball drop, downhole flow control, and the like thereof. In a non-limiting example, isolating a previous rock region may include placing a mechanical isolation device such as, without limitation, a solid expandable liner in between two rock regions. Persons skilled in the art, upon reviewing the entirety of this disclosure, will be aware of the various mechanical isolation for isolating the previous rock region.

With continued reference to FIG. 1, apparatus 100 includes a computing device communicatively connected to pump 148. Computing device includes at least a processor 104 and a memory communicatively connected to the at least a processor 104. Processor 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail via a network interface device. Network interface device may be utilized for connecting processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus, or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of computing devices in a first location and a second computing device or cluster of computing devices in a second location. Processor 104 may include one or more computing devices dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented using a "shared nothing" architecture in which data is cached at the worker, in an embodiment, this may enable scalability of apparatus 100 and/or computing device.

With continued reference to FIG. 1, processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, as used in this disclosure, "communicatively connected" means connected by way of a connection, attachment, or linkage between two or more relata which allows for reception and/or transmittance of information therebetween. For example, and without limitation, this connection may be wired or wireless, direct, or indirect, and between two or more components, circuits, devices, systems, apparatus and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure. In a non-limiting example, pump 148 may be connected to processor 104 of computing device wirelessly.

With continued reference to FIG. 1, apparatus 100 may include a sensing device 108. As used in this disclosure, a "sensing device" is a component that is configured to detect a phenomenon and transmit information related to the detection of the phenomenon. In an embodiment, sensing device may include a sensor. For example, a sensor may transduce a detected phenomenon, such as without limitation, current, speed, direction, force, torque, moisture, temperature, pressure, geographic location, resistance, touch sensors, viscosity, fluid state, fluid density, and the like, into a sensed signal. In some embodiments, sensing device 108 may include one or more sensors which may be the same, similar, or different. In other embodiments, sensing device 108 may include one or more sensor suites with sensors in each sensor suite being the same, similar, or different. In a non-limiting example sensing device 108 may include a plurality of sensors disposed downhole, particularly along a borehole of a well. Borehole may be horizontal or vertical. Each sensor of plurality of sensors may be equidistant from its neighboring sensors. Additionally, or alternatively, sensing device 108 may include sensor such as, without limitation, temperature sensor, accelerometer, gyro meter, pressure sensor, GPS, speed gauge, voltage sensors, current sensors, ohm sensors, touch sensors, viscosity sensor, motion sensor, density sensor, flow rate sensor, downhole gauge, electricity usage meter, multimeters, a carbon emissions sensor, natural gas sensor, image sensor, scale, materials sensor, micro seismic geophones, fiber optic sensors, radiation sensors, rotational sensors, venturi flow meters, and the like thereof. Further, sensing device 108 may be disposed at various locations such as, without limitation, on the surface of the earth, downhole in a treatment well, downhole in a nearby well (i.e., listener well), and the like thereof.

With continued reference to FIG. 1, in an embodiment, sensing device 108 may include a seismic sensor. As used in this disclosure, a "seismic sensor" is a sensor with capability of detecting ground noise and movement. In a non-limiting example, seismic sensor may respond to ground noises and shaking such as caused by earthquakes, volcanic eruptions, explosions, fracking, and the like thereof. In some embodiment, seismic sensor may include a component that converts ground movement into a voltage measurement (volt), wherein the voltage measurement is a difference in electric potential (in a static electric field) between two points. Voltage measurement may be stored in data store 140 described in further details below. In a non-limiting example, sensing device 108 may include a geophone with sensitivity of 30 volts per meter per second, wherein the geophone is configured to measure a ground motion during fracking and convert the ground motion into a voltage measurement, wherein the voltage measurement may be used to determine a seismic response through comparison of voltage measurement to its baseline/which may then be used to analyze downhole condition 120 described below in this disclosure. In some embodiments, sensing device 108 may include an injection/flow back sensor, wherein the injection/flow back sensor may be configured to measure data regarding to reservoir such as, without limitation, fluid flow, fluid flow rate, fluid pressure, and the like before and/or after fracking process through controlling a fluid in the wellbore. In a non-limiting example, a fluid may be inject into a stage and flew back and a first fluid flow may be measured by injection/flow back sensor. A second fluid flow may be measured using injection/flow back sensor in the same manner after fracking process, wherein the second fluid flow may be different than first fluid flow. In other embodiments, sensing device 108 may include a diagnostic fracture injection (DFI) sensor which is similar to injection/flow back sensor described above. Additionally, or alternatively, sensing device 108 may include a fiber optic sensor, wherein the fiber optic sensor may be configured to measure vibration and/or temperature changes underground. In a non-limiting example, sensing device 108 may include a plurality of fiber optic sensors placed in a string, wherein the string may run in a well casing. Plurality of fiber optic sensors may measure a temperature change outside of well casing. Plurality of fiber optic sensor may further measure a fluid movement within well casing during production. Further, sensing device 108 may include downhole condition sensor; for instance, downhole condition sensor may be consistent with any downhole condition sensor disclosed in Non-provisional application Ser. No. 17/968,077 filed on Oct. 18, 2022 and entitled "AN APPARATUS AND METHOD FOR PREDICTING DOWNHOLE CONDITIONS," the entirety of which is incorporated herein by reference. Persons skilled in the art, upon reviewing the entirety of this disclosure, will be aware of the various embodiments of sensing device 108.

With continued reference to FIG. 1, as used in this disclosure, a "signal" is any intelligible representation of data, for example from one device to another. A signal may include an optical signal, a hydraulic signal, a pneumatic signal, a mechanical, signal, an electric signal, a digital signal, an analog signal and the like. In some cases, a signal may be used to communicate with a computing device, for example by way of one or more ports. In some cases, a signal may be transmitted and/or received by a computing device for example by way of an input/output port. An analog signal may be digitized, for example by way of an analog to digital converter. In some cases, an analog signal may be processed, for example by way of any analog signal processing steps described in this disclosure, prior to digitization. In some cases, a digital signal may be used to communicate between two or more devices, including without limitation computing devices. In some cases, a digital signal may be communicated by way of one or more communication protocols, including without limitation internet protocol (IP), controller area network (CAN) protocols, serial communication protocols (e.g., universal asynchronous receiver-transmitter [UART]), parallel communication protocols (e.g., IEEE 128 [printer port]), and the like.

With continued reference to FIG. 1, in some cases, apparatus 100 may perform one or more signal processing steps on a signal. For instance, apparatus 100 may analyze, modify, and/or synthesize a signal representative of data in order to improve the signal, for instance by improving transmission, storage efficiency, or signal to noise ratio. Exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which varying continuously within a domain, for instance time. Exemplary non-limiting continuous time processes may include time domain processing, frequency domain processing (Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point and floating-point, real-valued and complex-valued, multiplication and addition. Digital signal processing may additionally operate circular buffers and lookup tables.

With continued reference to FIG. 1, in some embodiments, processor 104 may be remote to sensing device 108 and communicatively connected with sensing device 108 by way of one or more networks. Network may include, but not limited to, a cloud network, a mesh network, or the like. By way of example, a "cloud-based" system, as that term is used herein, can refer to a system which includes software and/or data which is stored, managed, and/or processed on a network of remote servers hosted in the "cloud," e.g., via the Internet, rather than on local severs or personal computers. A "mesh network" as used in this disclosure is a local network topology in which the processor 104 and/or sensing device 108 connect directly, dynamically, and non-hierarchically to as many other computing devices as possible. A "network topology" as used in this disclosure is an arrangement of elements of a communication network. In a non-limiting example, a processor 104 may send instructions of any processing step described in this disclosure to a sensing device 108 through a wireless wide area network, wherein the processor 104 and the sensing device 108 may be connected to the wireless wide area network. Processor 104 may further receive, without limitation, any data, information, signals, and/or the like described in this disclosure from sensing device 108 through wireless wide area network. In other embodiments, pump 148 may be connected with sensing device 108 and/or processor 104 in similar manner.

With continued reference to FIG. 1, processor 104 is configured to receive a reservoir data 112. As used in this disclosure, "receive" means to accept, collect, or otherwise receive reservoir data 112. In some embodiments, reservoir data 112 may be received by processor 104 from sensing device 108. Sensing device 108 may be any sensing device, sensor, or computing device described above in this disclosure. In a non-limiting example, sensing device 108 include one or more sensors configured to measure reservoir data 112 and transmit measured reservoir data 112 as one or more signals to processor 104. Processor 104 may accept these signals and perform any signal processing steps described in this disclosure on these signals. As used in this disclosure, "reservoir data" is data related to a reservoir as described above in this disclosure. In a non-limiting example, reservoir data may include data related to rock region described above. In some cases, reservoir data 112 may include one or more quantitative measurements measured using sensing device 108 described above such as, without limitation, fluid flow rate, fluid pressure, formation pressure, temperature, and the like thereof. In other cases, reservoir datum 116 may include one or more quantitative measurements from geological exploration such as, without limitation, water exploration, rock exploration, mineral exploration, and the like thereof. Such quantitative measurements may include shale volume, gross and net thickness of the drilled layers, rock elastic moduli, permeability measurement, depth measurement, any quantity represents one or more aspects of the reservoir, and the like thereof. In some cases, reservoir data 112 may include one or more graphical data of the reservoir. In a non-limiting example, reservoir data 112 may include a seismic graph, wherein the seismic graph is a geological graph of the reservoir observed in different levels. Seismic graph may include reservoir geometry, structural features, and the like thereof. In other embodiments, reservoir data 112 may further include other type of data describing the reservoir such as, without limitation, historical migration, type of geological trap, reservoir heterogeneity, and the like thereof. In some embodiments, receiving reservoir data 112 from sensing device 108 may include collecting reservoir data 112 from, without limitation, seismic survey, well log, conventional and special core analyses, fluid analyses, pressure-transient test, periodic well production test, and the like thereof. In a non-limiting example, reservoir data in the current disclosure may be consistent with any reservoir datum disclosed in U.S. patent application Ser. No. 17/986,375 filed on Nov. 14, 2022 and entitled "AN APPARATUS AND METHOD FOR FRACKING OPTIMIZATION," the entirety of which is incorporated herein by reference. Persons skilled in the art, upon reviewing the entirety of this disclosure, will be aware of the various reservoir data and ways of reservoir data acquisition.

With continued reference to FIG. 1, in some embodiments, reservoir data 112 may be stored in a data store 140 such as, without limitation, a database. Database may be implemented, without limitation, as a relational database, a key-value retrieval database such as a NOSQL database, or any other format or structure for use as a database that a person skilled in the art would recognize as suitable upon review of the entirety of this disclosure. Database may alternatively or additionally be implemented using a distributed data storage protocol and/or data structure, such as a distributed hash table or the like. Database may include a plurality of data entries and/or records as described above. Data entries in a database may be flagged with or linked to one or more additional elements of information, which may be reflected in data entry cells and/or in linked tables such as tables related by one or more indices in a relational database. In a non-limiting example, receiving reservoir data 112 may include retrieving reservoir data 112 from data store 140 using one or more data store queries. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure.

With continued reference to FIG. 1, in some embodiments, reservoir data 112 may include a fluid parameter 116. As used in this disclosure, a "fluid parameter" is a datum related to the output fluid of the well. Output fluid may include, without limitation, fracking fluid, oil, natural gas, and the like thereof. In a non-limiting example, sensing device 108 may be configured to measure reservoir data 112 containing fluid parameters such as, without limitation, fluid flow, fluid flow rate, leakoff coefficients, pump rate, fluid viscosity, fluid temperature, fluid state (i.e., liquid, solid, or gas), fluid depth, fluid pressure, fluid composition, and the like thereof. In some cases, fluid parameter 116 within reservoir data 112 may be manually collected through a fluid experiment. In a non-limiting example, a plurality of fluid parameters may be received by performing a PVT study in a lab. Plurality of fluid parameters may include, without limitation, initial system composition, bubble point pressure, volume of oil, volume and composition of the gas, oil viscosity, and the like there of. Additionally, or alternatively, reservoir data 112 may further include historical reservoir data 112. As used in this disclosure, "historical reservoir data" is reservoir data related to a historical reservoir; for instance, historical reservoir data may include reservoir data received from an existing and/or currently operating well prior and/or after fracking. In some embodiments, historical reservoir data 112 may be collected manually by a user such as, without limitation, professional, engineer, operator, any individual who uses apparatus 100 for multi-stage fracking, and the like thereof. In other cases, user may include a group of people, such as, without limitation, team, enterprise, and the like thereof. Further, historical reservoir data 112 may be stored in and/or retrieved from data store 140 described above in this disclosure.

With continued reference to FIG. 1, reservoir data 112 may further include a downhole condition 120. As used in the current disclosure, "downhole condition" refers to any event, occurrence, status, that occurs downhole. Examples of downhole conditions may include temperature, pressure, force, motion, and the like. Downhole condition 120 may be measured using sensing device 108 described in this disclosure. Measured downhole conditions may be taken from wells that are similarly situated to the target well. Well may be similarly situated as a function of condition datum, well geography, or other circumstances. In an embodiment, downhole conditions 120 may include hydrostatic pressure, formation pressure, fracture pressure, bottomhole pressure, formation integrity test, equivalent circulating densities, differential pressure, bottomhole fracking gradient, pressure transients, rate transients, and the like. Downhole condition 120 may further include a future downhole condition, wherein the future downhole condition is projected downhole condition of the well in the future. In a non-limiting example, downhole condition, measured downhole condition, and future downhole condition in the current disclosure may be consistent with any downhole condition, measured downhole condition, and predicted downhole condition disclosed in Non-provisional application Ser. No. 17/968,077 filed on Oct. 18, 2022 and entitled "AN APPARATUS AND METHOD FOR PREDICTING DOWNHOLE CONDITIONS," the entirety of which is incorporated herein by reference.

With continued reference to FIG. 1, processor 104 is further configured to determine an optimal fracking stimulation parameter 136 as a function of reservoir data 112. As used in this disclosure, a "fracking stimulation parameter" is a parameter required for performing a fracking stimulation. In some cases, fracking stimulation parameter may include, without limitation, fracking fluid composition, fracking fluid temperature, fracking fluid volume, fracking fluid pressure, fracking fluid flow rate, depth, pump rate, fracture quantity, depth of fractures, proximity of fractures, and the like thereof. In some embodiments, fracking stimulation may include employing a plurality of fracking stimulation parameters. In a non-limiting example, pump 148 may inject fracking fluid based on a first fracking stimulation parameter of 300,000 gallons of fracking fluid volume, and a second fracking stimulation parameter of 9,000 pounds per square inch (psi) of fracking fluid pressure to create 100 fractures of a third fracking stimulation parameter of fracture quantity. As used in this disclosure, an "optimal fracking stimulation parameter" is a fracking stimulation parameter for a rock region, wherein the rock region may produce greatest quantity of natural resources such as, without limitation, oil, gas, and the like during well production after performing fracking stimulation according to the fracking stimulation parameter. In a non-limiting example, optimal fracking stimulation parameter 136 may include an optimal fracking stimulation coordinate, wherein the optimal fracking stimulation coordinate may determine the best location of rock region to create discrete fracture network that produces the maximum amount of natural resources. Continuing the non-limiting example, optimal fracking stimulation parameter 136 may include an optimal fracking stimulation depth, wherein the optimal fracking stimulation depth may determine the best horizontal level of rock region at which to perform the fracking stimulation in order to utilize the well to extract the majority of the natural resources at optimal fracking stimulation coordinate. Additionally, or alternatively, optimal fracking stimulation parameter may include an optimal fracking stimulation parameter, wherein the optimal fracking stimulation parameter is a parameter for a well and its operation during production after fracking that maximize natural resource production of the well; for instance, optimal fracking stimulation parameter described here may be consistent with any optimal fracking stimulation parameter disclosed in U.S. patent application Ser. No. 17/986,375 filed on Nov. 14, 2022 and entitled "AN APPARATUS AND METHOD FOR FRACKING OPTIMIZATION," the entirety of which is incorporated herein by reference.

With continued reference to FIG. 1, in some embodiments, determining optimal fracking stimulation parameter 136 may include modeling a fracking simulation model 124 as a function of the reservoir data 112 and determining optimal fracking stimulation parameter 136 as a function of the fracking simulation model 124. As used in this disclosure, "modeling" means translating and/or inputting one or more objects such as, without limitation, reservoir data 112 into a computational model, wherein the computational model is simply one or more mathematical equations. As used in this disclosure, a "fracking simulation model" is a computational model that represents fracking process described above. In some embodiments, fracking simulation model may be configured to output one or more optimal fracking stimulation parameters such as, without limitation, rock deformation, fluid flow rate, fracture propagation and the like as a function of one or more reservoir data 112. In a non-limiting example, fracking simulation model 124 may be configured to calculate a rock deformation as a function of reservoir data 112 such as, without limitation, movement of particles or blocks within the reservoir using an elastoplastic behavior such as, without limitation, linear elasticity. In a non-limiting example, fracking simulation model 124 may be configured to simulate a fluid flow in a fracture by implementing lubrication theory using Poiseuille's law that relate reservoir data 112 such as, without limitation, fluid parameter 116 such as, without limitation, fluid flow rate and downhole condition 120 such as, without limitation, pressure gradient along discrete fracture network within rock region and calculate a fluid flow rate using the simulation. In a non-limiting example, fracking simulation model 124 may be configured to calculating a fracture propagation of discrete fracture network within rock region by employing a linear elastic fracture mechanics (LEFM), wherein the linear elastic fracture mechanics may include a LEFM criteria which includes an evaluation of a plurality of reservoir data. Evaluation of plurality of reservoir data may include, without limitation, maximum tensile stress criterion, minimum strain energy density criterion, maximum principal strain criterion, maximum strain criterion, and the like. In other embodiments, fracking simulation model 124 may be configured to output one or more other optimal fracking stimulation parameters such as, without limitation, proppant transportation, leakoff coefficient, fracking gradient, wellhead pressure, flush volumes, slurry rate, pump horsepower, and the like thereof. Persons skilled in the art, upon reviewing the entirety of this disclosure, will be aware of the various optimal fracking stimulation parameters and ways of calculating optimal fracking stimulation parameters using fracking simulation model. fracking simulation model 124 described here may be consistent with any fracking simulation model disclosed in U.S. patent application Ser. No. 17/986,375 filed on Nov. 14, 2022 and entitled "AN APPARATUS AND METHOD FOR FRACKING OPTIMIZATION," the entirety of which is incorporated herein by reference.

With continued reference to FIG. 1, in some embodiments, receiving reservoir data may include generating fracking training data as a function of reservoir data 112 and optimal fracking stimulation parameter 136. Optimal fracking stimulation parameter 136 may be determined using any processing step described in this disclosure. As used in this disclosure, a "fracking training data" is training data that is used for training machine-learning models such as, without limitation, fracking optimization machine-learning model 132. fracking optimization machine-learning model 132 disclosed here will be described in further detail below. As used in this disclosure, "training data" is data containing correlations that a machine-learning process may use to model relationships between two or more categories of data elements. In a non-limiting example, fracking training data 128 includes a plurality of reservoir data as input correlated to a plurality of optimal fracking stimulation parameters as output. Reservoir data may include any reservoir data described in this disclosure. In some embodiments, generating fracking training data 128 may further include converting reservoir data 112 and optimal fracking stimulation parameter 136 into a cleansed data format using a data conversion module. As used in this disclosure, a "cleansed data format" is a format and/or structure for data where the data is transformed from an unprocessed format and/or structure into a processed format and/or structure that is prepared for use in the generation and training of an artificial intelligence (AI) model, for example a machine learning model, a neural network, and the like. Reservoir data 112 that is placed into a cleansed data format may be referred to as a cleansed reservoir data. Similarly, optimal fracking stimulation parameter 136 that is placed in a cleansed data format may be referred to as cleansed optimal fracking stimulation parameter. A cleansed data format may be used to ensure data used for the generating and training of the AI model is relevant and accurate to generate an optimal AI model. A cleansed data format may also include data that is transformed by constructive transformation, destructive transformation, and/or structural transformation into the process format and/or structure. In some embodiments, constructive transformation of data may include adding data, replicating data, and the like. In some embodiments, destructive transformation of data may include fixing or removing incorrect, corrupted, incorrectly formatted, duplicate, or incomplete data within a dataset, and the like. In some embodiments, structural transformation of data may include moving and/or combining columns of data in a data set, and the like. The converting of data may include the processing, cleansing, standardizing, and categorizing of data into a cleansed data format for use in generating an accumulated artificial intelligence (AI) model. In an embodiment, the conversion of reservoir data 112 and optimal fracking stimulation parameter 136 may include the processing, cleansing, and standardizing of data into a data set and/or data bucket for use in generating an artificial intelligence model The conversion of data into a cleansed data format in the current disclosure may be consistent with the conversion of data into a cleansed data format disclosed in Non-provisional application Ser. No. 17/853,143 filed on Jun. 29, 2022 and entitled "APPARATUS AND METHOD FOR GENERATING A COMPILED ARTIFICIAL INTELLIGENCE (AI) MODEL," the entirety of which is incorporated herein by reference. Additionally, or alternatively, processor 104 may be configured to store fracking training data 128 in data store 140 described above. In other embodiments, without limitation, generating fracking training data 128 may include retrieving fracking training data 128, reservoir data 112, optimal fracking stimulation parameter 136, and/or the like from data store 140 through one or more data store queries.

With continued reference to FIG. 1, in some embodiments, determining optimal fracking stimulation parameter may include training a fracking optimization machine-learning model 132 using fracking training data 128. As used in the current disclosure, a "fracking optimization machine learning model" is a mathematical and/or algorithmic representation of a relationship between inputs and outputs. fracking optimization machine-learning model 132 may be similar to the machine learning model mentioned herein below in FIG. 2. Inputs to the to the fracking optimization machine-learning model 132 may include, without limitation, reservoir data 112, fluid parameter 116, downhole condition 120, and the like thereof. Inputs to the fracking optimization machine-learning model 132 may additionally include cleansed reservoir data described above. Output of fracking optimization machine-learning model 132 may include, without limitation, optimal fracking stimulation parameter 136, and the like thereof. Output of fracking optimization machine-learning model 132 may additionally include cleansed optimal fracking stimulation parameter described above. fracking optimization machine-learning model 132 may be trained using fracking training data 128 described above in this disclosure. Optimal fracking stimulation parameter 136 may then be determined as a function of trained fracking optimization machine-learning model 132. In some embodiments, processor 104 may be configured to create machine-learning model such as, without limitation, fracking optimization machine-learning model 132 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm mounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g., a quadratic, cubic or higher-order equation) providing a best predicted output/actual output fit is sought; similar methods to those described above may be applied to minimize error functions, as will be apparent to persons skilled in the art upon reviewing the entirety of this disclosure. In a non-limiting example, fracking optimization machine-learning may take reservoir datum from the user and output one or more optimal fracking stimulation parameter using one or more underlying regression model within fracking optimization machine-learning model 132. fracking optimization machine-learning model 132 described here may be consistent with any fracking optimization machine-learning model disclosed in U.S. patent application Ser. No. 17/986,375 filed on Nov. 14, 2022 and entitled "AN APPARATUS AND METHOD FOR FRACKING OPTIMIZATION," the entirety of which is incorporated herein by reference.

With continued reference to FIG. 1, In some embodiments, determining optimal fracking stimulation parameter 136 may be determined using a fuzzy logic. Machine learning models, such as fracking optimization machine-learning model 132, may be implemented as a fuzzy inferencing system described in more detail with reference to FIG. 5. As used in the current disclosure, a "fuzzy inference" is a method that interprets the values in the input vector (i.e., reservoir data 112 and optimal fracking stimulation parameter 136) and, based on a set of rules, assigns values to the output vector. A fuzzy set may also be used to show degree of match between fuzzy sets may be used to rank one resource against another. For instance, if both excessive reservoir data 112 and fracking stimulation parameter have fuzzy sets, optimal fracking stimulation parameter 136 may be determined by having a degree of overlap exceeding a predetermined threshold.

With continued reference to FIG. 1, processor 104 is further configured to identify a fracking stage 144 as a function of optimal fracking stimulation parameter 136. As used in this disclosure, a "fracking stage" is a single step in a fracking process described above in this disclosure. In a non-limiting example, fracking stage 144 may include a single step of fracturing in a single rock region. In some cases, fracking process may include an optimal fracking process, wherein the optimal fracking processes is a process of fracturing which ensures a maximum production of natural resource of a reservoir. In some cases, fracking stage may include steps such as, without limitation, water acquisition, chemical mixing, well injection, produced water handling, wastewater disposal and reuse, and the like thereof. In a non-limiting example, fracking stage 144 may include a hydraulic fracture stimulation activity based on a plurality of optimal fracking stimulation parameters for a selected rock region during well completion. In some embodiments, fracking stage may include one or more optimal fracking stimulation parameters such as, without limitation, fracking fluid composition, fracking fluid temperature, fracking fluid volume, fracking fluid pressure, fracking fluid flow rate, depth, pump rate, fracture quantity, depth of fractures, proximity of fractures, and the like associate with it. In some cases, fracking may include a plurality of fracking stages. In some embodiments, identifying fracking stage 144 may include identifying fracking stage 144 as a function of usage of mechanical isolation. Mechanical isolation may include any mechanical isolation described in this disclosure. In a non-limiting example, fracking stage 144 may be different based on different types of well completion; for instance, for open hole completion, processor 104 may identify a first fracking stage of creating a first discrete fracture network in a first rock region located at the end of the wellbore and a second fracking stage of creating a second discrete fracture network in a second rock region located right next to the first rock region and toward the start of the wellbore. On the other hand, for well completion that use a jet perforation gun to create a jet for each rock region, processor 104 may identify a first fracking stage of perforating the casing around the wellbore of a rock region and a second fracking stage of creating a discrete fracture network in the rock region. In other embodiments, each fracking stage of plurality of fracking stages may include same set of fracking stimulation parameters for plurality of rock regions within reservoir. Additionally, or alternatively, fracking stage may include temporal information. As used in this disclosure, "temporal information" refers to the time associated with identified fracking stage 144. In a non-limiting example, fracking stage may include a specified start time and/or end time. Continuing the non-limiting example, fracking stage may include a specified time interval between current fracking stage and other fracking stages. Further, fracking stage may include an optimal production plan, wherein the optimal production plan is a plan for production of the well formulated based on optimal fracking stimulation parameter 136. In a non-limiting example, optimal production plan described here may be consistent with any optimal production plan disclosed in U.S. patent application Ser. No. 17/986,375 filed on Nov. 14, 2022 and entitled "AN APPARATUS AND METHOD FOR FRACKING OPTIMIZATION," the entirety of which is incorporated herein by reference.

With continued reference to FIG. 1, processor 104 is further configured to adjust a pump configuration 152 of the pump 148 as a function of identified fracking stage 144. As used in this disclosure, "adjust" means to change, modify, or otherwise configure pump 148 based on fracking stage 144. As used in this disclosure, a "pump configuration" is an arrangement of each of function units of pump 148. In some cases, pump configuration 152 may be determined as a function of optimal fracking stimulation parameter 136. Pump configurations 152 may include, without limitation, pump power source, pump horsepower, pump input, pump output, valve status, pump rate, and the like thereof. In a non-limiting example, adjusting pump 148 may include setting a pump horsepower, wherein the pump horsepower may be determined by multiplying pump rate by wellhead pressure (WHP) within optimal fracking stimulation parameter 136. In another non-limiting example, adjusting pump 148 may include changing a valve status of a value, wherein the valve may be installed near an outlet of pump 148. Fracking stage 144 may include opening valve to release a fracking fluid and closing valve to terminate the release of the fracking fluid. Processor 104 may be configured to control opening and closing of valve according to fracking stage 144. In other non-limiting examples, processor 104 may set a plurality of initial pump configurations of pump 148 before or at the beginning of the fracking process. Continuing the non-limiting example, processor 104 may adjust pump 148 to a new set of pump configurations after fracking process has been initiated for a period of time. In some cases, new set of pump configurations may be completely or partially different than initial pump configurations. In other cases, new set of pump configurations may be same as initial pump configurations. Persons skilled in the art, upon reviewing the entirety of this disclosure, will be aware of the various pump configurations and ways of determining pump configurations based on optimal fracking stimulation parameters.

With continued reference to FIG. 1, in a non-limiting example, well development may include performing a fracking process on a reservoir containing a plurality of rock regions. Fracking process may include a first fracking stage for a first rock region, wherein the first fracking stage may include a usage of a first fracking fluid containing 90% of water, 9.5% of sand or proppant, and 0.5% of chemical (i.e., acid, friction reducer, surfactant, gelling agent, cross-linker, buffers, and the like thereof). First fracking fluid may be injected into first rock region using pump 148 as a first pump input at a first fracking fluid pressure to create a first discrete fracture network. Pump 148 may include 20 pumps. Pump 148 may be configured to pump first fracking fluid at a first pump hydraulic horsepower (HHP) of 35,000 HHP and a first pump rate of 110 barrel per minute. Fracking process may include a second fracking stage for a second rock region, wherein the second rock region may include a usage of a second fracking fluid containing 92% of water, 7% of sand or proppant, and 1% of chemical. Second rock region may be isolated with first rock region using mechanical isolation such as, without limitation, a solid expandable liner, and the like thereof. Pump 148 may be adjusted from a first pump hydraulic horsepower to a second pump hydraulic horsepower of 38,000 HHP and first pump rate to a second pump rate of 120 barrels per minute at second fracking stage. Second fracking fluid may be injected into second rock region using pump 148 as a second pump input at a second fracking fluid pressure to create a second discrete fracture network, wherein the second fracking fluid pressure may be different than first fracking fluid pressure, and wherein the second discrete fracture network may include different number of fractures than first discrete fracture network.

With continued reference to FIG. 1, in some embodiments, adjusting pump 148 may include delivering a diverting agent into rock region, wherein the diverting agent may be configured to prevent fracking fluid from entering rock zone. As used in this disclosure, a "diverting agent" is a chemical agent used in fracking stimulation that ensure uniform injection over rock region. In a non-limiting example, benzoic acid may be used as diverting agent during matrix acidizing of injection wells. In another non-limiting example, oil-soluble resins may be used as diverting agent in production wells. In some embodiments, diverting agent may include physical diverting agent. In a non-limiting example, physical diverting agent may include one or more balls and/or bags of material that may dissolve, flow back to surface, or high concentration slugs of proppant that plugs fissures or fractures in the casing, liner, and/or space between pipe and the formation or the near, medium, and far field of the fracture. In some embodiments, optimal fracking stimulation parameter and/or fracking stage may include data regarding diverting agent such as, without limitation, diverting agent type, composition, deliver time, and the like thereof. In a non-limiting example, pump 148 may be configured to pumping fracking fluid until the machine-learning model, such as, without limitation, fracking optimization machine-learning model 132, fracking stage classifier described below, and the like, generates an output such as, without limitation, optimal fracking stimulation parameter 136, fracking stage 144, and the like indicating that an instant rock zone of rock region is fully stimulated; at this point users and/or apparatus 100 may send down diverting agents to stop injecting into the current rock zone or rock region. Users and/or apparatus 100 may begin fracking a next rock region after diverting agent is delivered.

With continued reference to FIG. 1, in some embodiments, processor 104 may be configured to generate a fracking stage classifier and classify optimal fracking stimulation parameter 136 to fracking stage 144 using the fracking stage classifier. Fracking stage classifier may be consistent with the classifiers discussed herein below in FIG. 2. Fracking stage classifier may be configured to categorize optimal fracking stimulation parameter 136. Categories may include fracking stage 144, fracking stimulation difficulty, well conditions, and the like thereof. Fracking stage classifier may be trained using fracking stage training data. In some cases, fracking stage training data may include reservoir data 112, optimal fracking stimulation parameter 136, fracking stage 144, and the like thereof. In a non-limiting example, fracking stage training data may include a plurality of optimal fracking stimulation parameters as input correlated to a plurality of fracking stages as output. As used in this disclosure, a "classifier" is a machine-learning model, such as a mathematical model, neural net, or program generated by a machine learning algorithm known as a "classification algorithm," as described in further detail below, that sort inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Processor 104 and/or another device may generate a classifier using a classification algorithm, defined as a process whereby processor 104 derives a classifier from training data. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

With continued reference to FIG. 1, in some embodiments, processor 104 may be configured to generate machine learning model such as, without limitation, fracking stage classifier, using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A) P(A) \div P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Processor 104 may then calculate a likelihood table by calculating probabilities of different data entries and classification labels. Processor 104 may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 1, in some embodiments, processor 104 may be configured to generate machine learning model such as, without limitation, fracking stage classifier, using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 1, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm: $l = \sqrt{\Sigma_{i=0}^{n} a_i^2}$, where $a_i$ is attribute number experience of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

Figure 2:
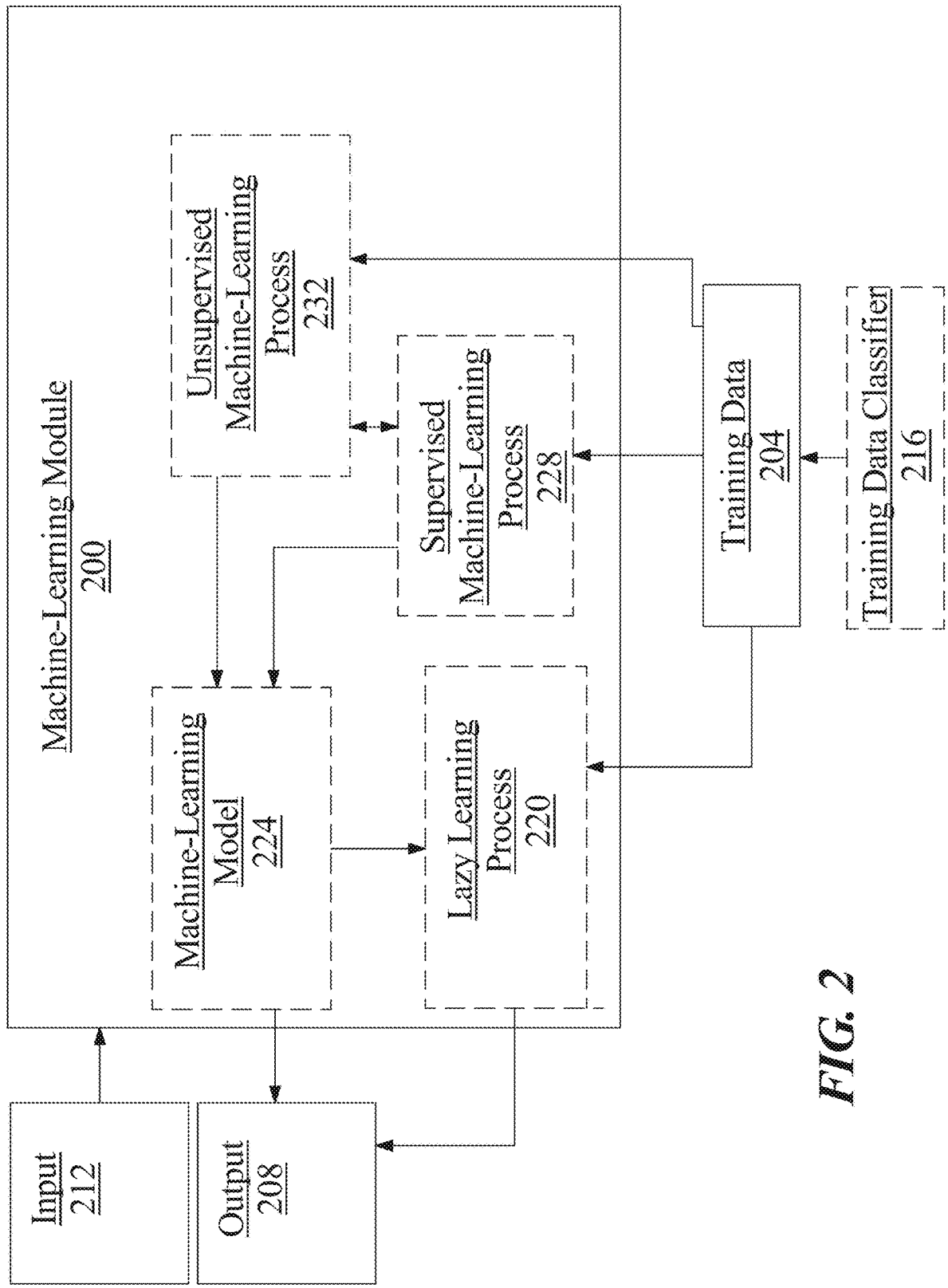
FIG. 2 is a block diagram of an exemplary machine-learning process.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 204 to generate an algorithm that will be performed by a computing device/module to produce outputs 208 given data provided as inputs 212; this is in contrast to a non-machine learning software program where the commands to be executed are determined in advance by a user and written in a programming language. Machine-learning module 200 may include training data 204. Training data 204 may include a plurality of data entries, each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively, or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below.

Training data 204 used by machine-learning module 200 may correlate any input data as described in this disclosure to any output data as described in this disclosure.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 200 may generate a classifier using a classification algorithm, defined as a process whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 2, machine-learning module 200 may be configured to perform a lazy-learning process 220 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively, or additionally, and with continued reference to FIG. 2, machine-learning processes as described in this disclosure may be used to generate machine-learning models 224. A "machine-learning model," as used in this disclosure, is a mathematical and/or algorithmic representation of a relationship between inputs and outputs, as generated using any machine-learning process including without limitation any process as described above and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created via the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include a reservoir data 112 and optimal fracking stimulation parameter 136 as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g., a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 3:
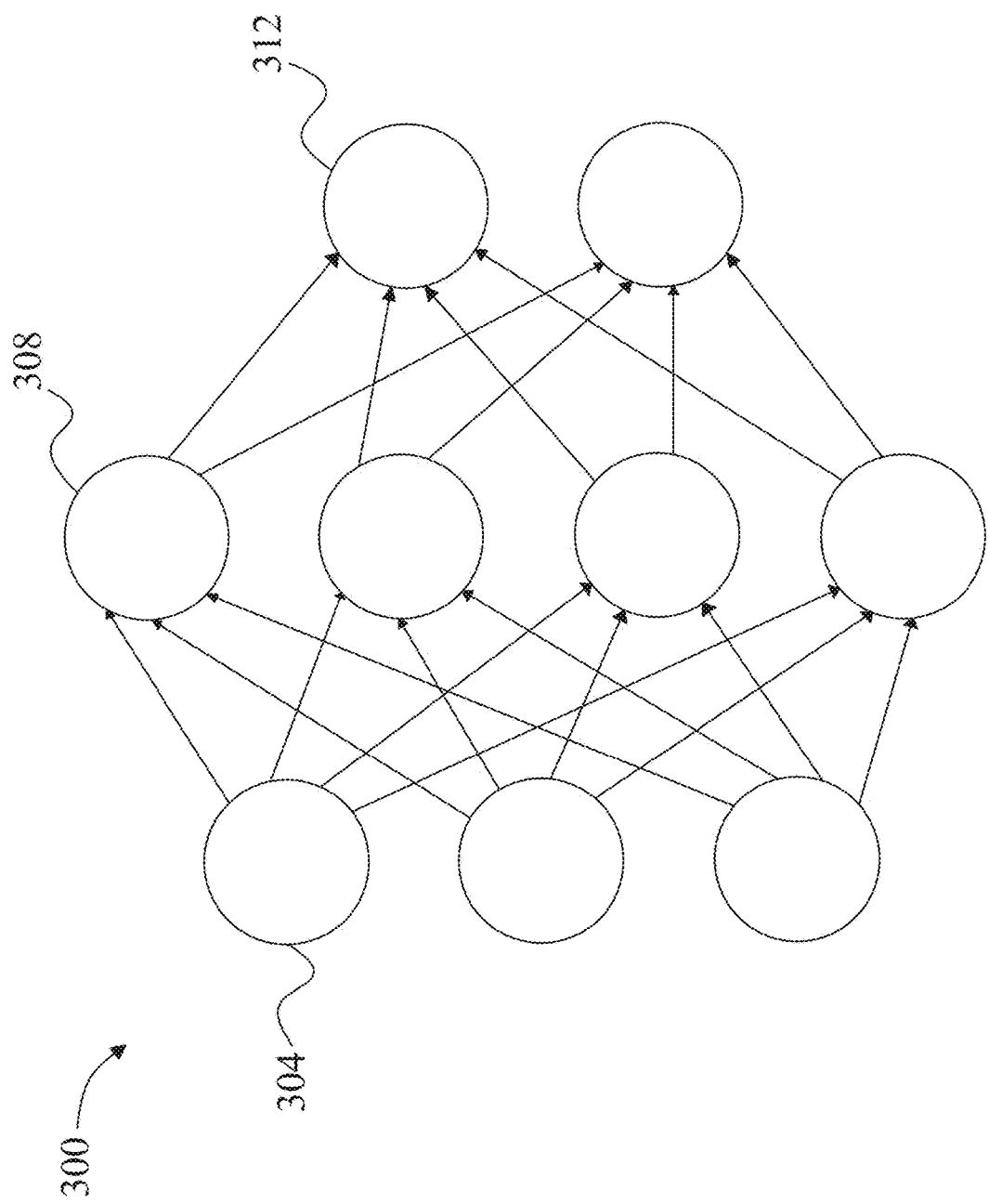
FIG. 3 is a diagram of an exemplary embodiment of neural network.

Referring now to FIG. 3, an exemplary embodiment of neural network 300 is illustrated. A neural network 300 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 304, one or more intermediate layers 308, and an output layer of nodes 312. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 4:
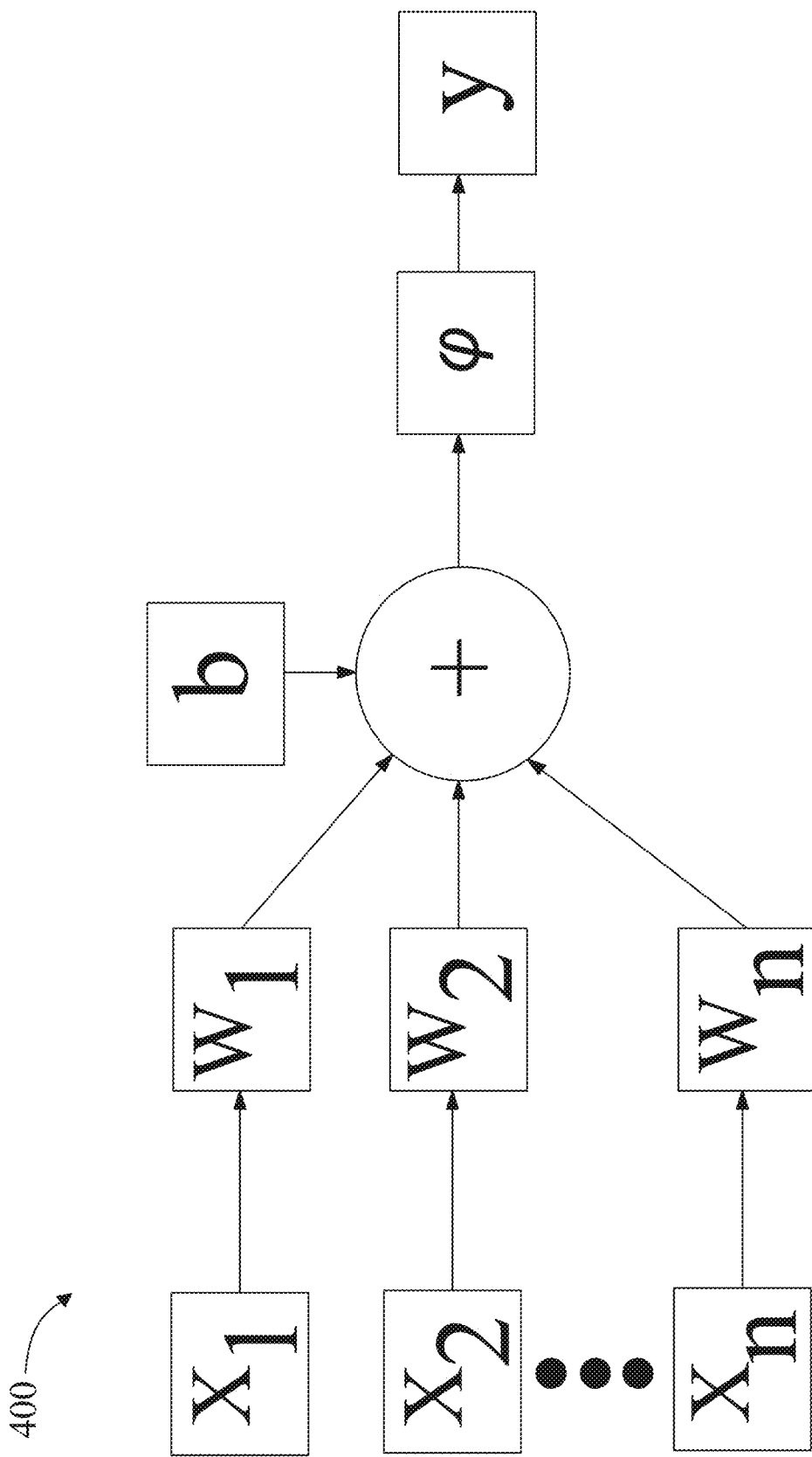
FIG. 4 is a diagram of an exemplary embodiment of a node of a neural network.

Referring now to FIG. 4, an exemplary embodiment of a node of a neural network is illustrated. A node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally, or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 5:
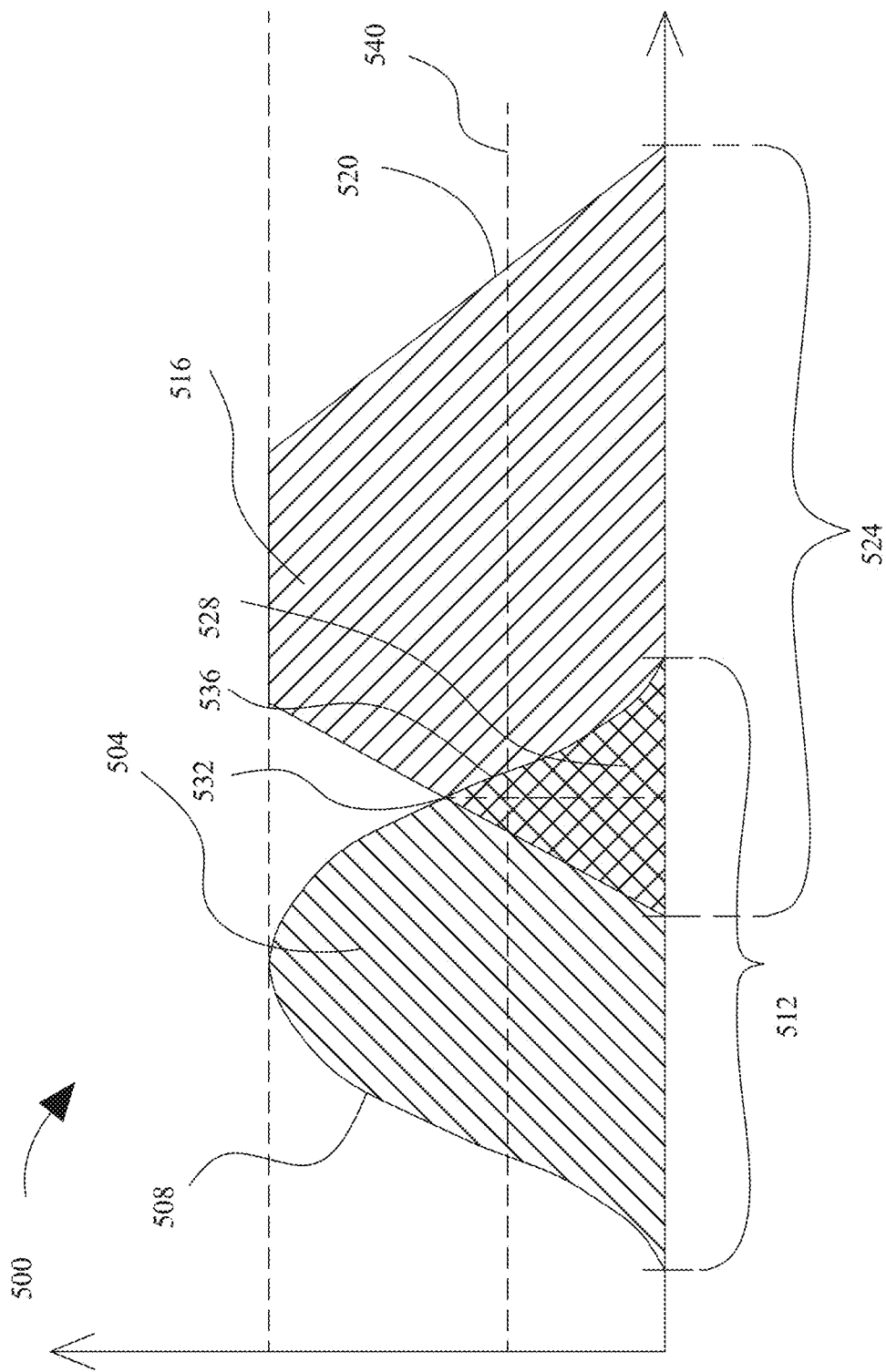
FIG. 5 is a schematic diagram illustrating an exemplary embodiment of a fuzzy inferencing system.

Referring to FIG. 5, an exemplary embodiment of fuzzy set comparison 500 is illustrated. A first fuzzy set 504 may be represented, without limitation, according to a first membership function 508 representing a probability that an input falling on a first range of values 512 is a member of the first fuzzy set 504, where the first membership function 508 has values on a range of probabilities such as without limitation the interval [0,1], and an area beneath the first membership function 508 may represent a set of values within first fuzzy set 504. Although first range of values 512 is illustrated for clarity in this exemplary depiction as a range on a single number line or axis, first range of values 512 may be defined on two or more dimensions, representing, for instance, a Cartesian product between a plurality of ranges, curves, axes, spaces, dimensions, or the like. First membership function 508 may include any suitable function mapping first range 512 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, \text{ for } x > c \text{ and } x < a \\ \frac{x-a}{b-a}, \text{ for } a \le x < b \\ \frac{c-x}{c-b}, \text{ if } b < x \le c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}(\frac{x-c}{\sigma})^2}$$

and a bell membership function may be defined as:

$$y(x, a, b, c) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 5, first fuzzy set 504 may represent any value or combination of values as described above, including output from one or more machine-learning models, such as, without limitation, fracking optimization machine-learning model, production plan classifier, and the like. A second fuzzy set 516, which may represent any value which may be represented by first fuzzy set 504, may be defined by a second membership function 520 on a second range 524; second range 524 may be identical and/or overlap with first range 512 and/or may be combined with first range via Cartesian product or the like to generate a mapping permitting evaluation overlap of first fuzzy set 504 and second fuzzy set 516. Where first fuzzy set 504 and second fuzzy set 516 have a region 528 that overlaps, first membership function 508 and second membership function 520 may intersect at a point 532 representing a probability, as defined on probability interval, of a match between first fuzzy set 504 and second fuzzy set 516. Alternatively, or additionally, a single value of first and/or second fuzzy set may be located at a locus 536 on first range 512 and/or second range 524, where a probability of membership may be taken by evaluation of first membership function 508 and/or second membership function 520 at that range point. A probability at 528 and/or 532 may be compared to a threshold 540 to determine whether a positive match is indicated. Threshold 540 may, in a non-limiting example, represent a degree of match between first fuzzy set 504 and second fuzzy set 516, and/or single values therein with each other or with either set, which is sufficient for purposes of the matching process; for instance, threshold may indicate a sufficient degree of overlap between an output from one or more machine-learning models and/or optimal fracking stimulation parameter and a predetermined class, such as without limitation reservoir data categorization, for combination to occur as described above. Alternatively, or additionally, each threshold may be tuned by a machine-learning and/or statistical process, for instance and without limitation as described in further detail below.

Further referring to FIG. 5, in an embodiment, a degree of match between fuzzy sets may be used to classify an optimal fracking stimulation parameter with reservoir data. For instance, if a reservoir data has a fuzzy set matching optimal fracking stimulation parameter fuzzy set by having a degree of overlap exceeding a threshold, computing device 104 may classify the optimal fracking stimulation parameter as belonging to the reservoir data categorization. Where multiple fuzzy matches are performed, degrees of match for each respective fuzzy set may be computed and aggregated through, for instance, addition, averaging, or the like, to determine an overall degree of match.

Still referring to FIG. 5, in an embodiment, an optimal fracking stimulation parameter may be compared to multiple reservoir data categorization fuzzy sets. For instance, optimal fracking stimulation parameter may be represented by a fuzzy set that is compared to each of the multiple reservoir data categorization fuzzy sets; and a degree of overlap exceeding a threshold between the optimal fracking stimulation parameter fuzzy set and any of the multiple reservoir data categorization fuzzy sets may cause processor 104 to classify the optimal fracking stimulation parameter as belonging to reservoir data categorization. For instance, in one embodiment there may be two reservoir data categorization fuzzy sets, representing respectively reservoir data categorization and a reservoir data categorization. First reservoir data categorization may have a first fuzzy set; Second reservoir data categorization may have a second fuzzy set; and optimal fracking stimulation parameter may have an optimal fracking stimulation parameter fuzzy set. Processor 104, for example, may compare an optimal fracking stimulation parameter fuzzy set with each of reservoir data categorization fuzzy set and in reservoir data categorization fuzzy set, as described above, and classify an optimal fracking stimulation parameter to either, both, or neither of reservoir data categorization or in reservoir data categorization. Machine-learning methods as described throughout may, in a non-limiting example, generate coefficients used in fuzzy set equations as described above, such as without limitation x, c, and σ of a Gaussian set as described above, as outputs of machine-learning methods. Likewise, optimal fracking stimulation parameter may be used indirectly to determine a fuzzy set, as optimal fracking stimulation parameter fuzzy set may be derived from outputs of one or more machine-learning models that take the optimal fracking stimulation parameter directly or indirectly as inputs.

Still referring to FIG. 5, a computing device may use a logic comparison program, such as, but not limited to, a fuzzy logic model to determine a reservoir data response. An reservoir data response may include, but is not limited to, measuring reservoir data, calculating production parameter, and the like; each such reservoir data response may be represented as a value for a linguistic variable representing reservoir data response or in other words a fuzzy set as described above that corresponds to a degree of degree of match of optimal fracking stimulation parameter as calculated using any statistical, machine-learning, or other method that may occur to a person skilled in the art upon reviewing the entirety of this disclosure. In other words, a given element of a first optimal fracking stimulation parameter may have a first non-zero value for membership in a first linguistic variable value such as a first optimal fracking stimulation parameter and a second non-zero value for membership in a second linguistic variable value such as a second optimal fracking stimulation parameter. In some embodiments, determining a reservoir data categorization may include using a linear regression model. A linear regression model may include a machine learning model. A linear regression model may be configured to map data of optimal fracking stimulation parameter, such as degree of match of optimal fracking stimulation parameter to one or more reservoir data parameters. A linear regression model may be trained using a machine learning process. A linear regression model may map statistics such as, but not limited to, quality of optimal fracking stimulation parameter, and the like. In some embodiments, determining a reservoir data of optimal fracking stimulation parameter may include using a reservoir data classification model. A reservoir data classification model may be configured to input collected data and cluster data to a centroid based on, but not limited to, frequency of appearance, linguistic indicators of quality, and the like. Centroids may include scores assigned to them such that quality of match of optimal fracking stimulation parameter may each be assigned a score. In some embodiments reservoir data classification model may include a K-means clustering model. In some embodiments, reservoir data classification model may include a particle swarm optimization model. In some embodiments, determining the reservoir data of an optimal fracking stimulation parameter may include using a fuzzy inference engine. A fuzzy inference engine may be configured to map one or more optimal fracking stimulation parameter data elements using fuzzy logic. In some embodiments, optimal fracking stimulation parameter may be arranged by a logic comparison program into reservoir data arrangement. An "reservoir data arrangement" as used in this disclosure is any grouping of objects and/or data based on skill level and/or output score. This step may be implemented as described above in FIGS. 1-4. Membership function coefficients and/or constants as described above may be tuned according to classification and/or clustering algorithms. For instance, and without limitation, a clustering algorithm may determine a Gaussian or other distribution of questions about a centroid corresponding to a given level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Further referring to FIG. 5, an inference engine may be implemented according to input and/or output membership functions and/or linguistic variables. For instance, a first linguistic variable may represent a first measurable value pertaining to optimal fracking stimulation parameter, such as a degree of match of an element, while a second membership function may indicate a degree of in reservoir data of a subject thereof, or another measurable value pertaining to optimal fracking stimulation parameter. Continuing the example, an output linguistic variable may represent, without limitation, a score value. An inference engine may combine rules, such as: "if the number of optimal fracking stimulation is 'high' and the fracking stimulation priority level is 'high', the fracking difficulty is 'hard'"—the degree to which a given input function membership matches a given rule may be determined by a triangular norm or "T-norm" of the rule or output membership function with the input membership function, such as min(a, b), product of a and b, drastic product of a and b, Hamacher product of a and b, or the like, satisfying the rules of commutativity (T(a, b)=T(b, a)), monotonicity: (T(a, b)≤T(c, d) if a≤c and b≤d), (associativity: T(a, T(b, c))=T(T(a, b), c)), and the requirement that the number 1 acts as an identity element. Combinations of rules ("and" or "or" combination of rule membership determinations) may be performed using any T-conorm, as represented by an inverted T symbol or "⊥," such as max(a, b), probabilistic sum of a and b (a+b−a*b), bounded sum, and/or drastic T-conorm; any T-conorm may be used that satisfies the properties of commutativity: ⊥(a, b)=⊥(b, a), monotonicity: ⊥(a, b)≤⊥(c, d) if a≤c and b≤d, associativity: ⊥(a, ⊥(b, c))=⊥(⊥(a, b), c), and identity element of 0. Alternatively, or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively, or additionally, output rules may be replaced with functions according to the Takagi-Sugeno-King (TSK) fuzzy model.

Figure 6:
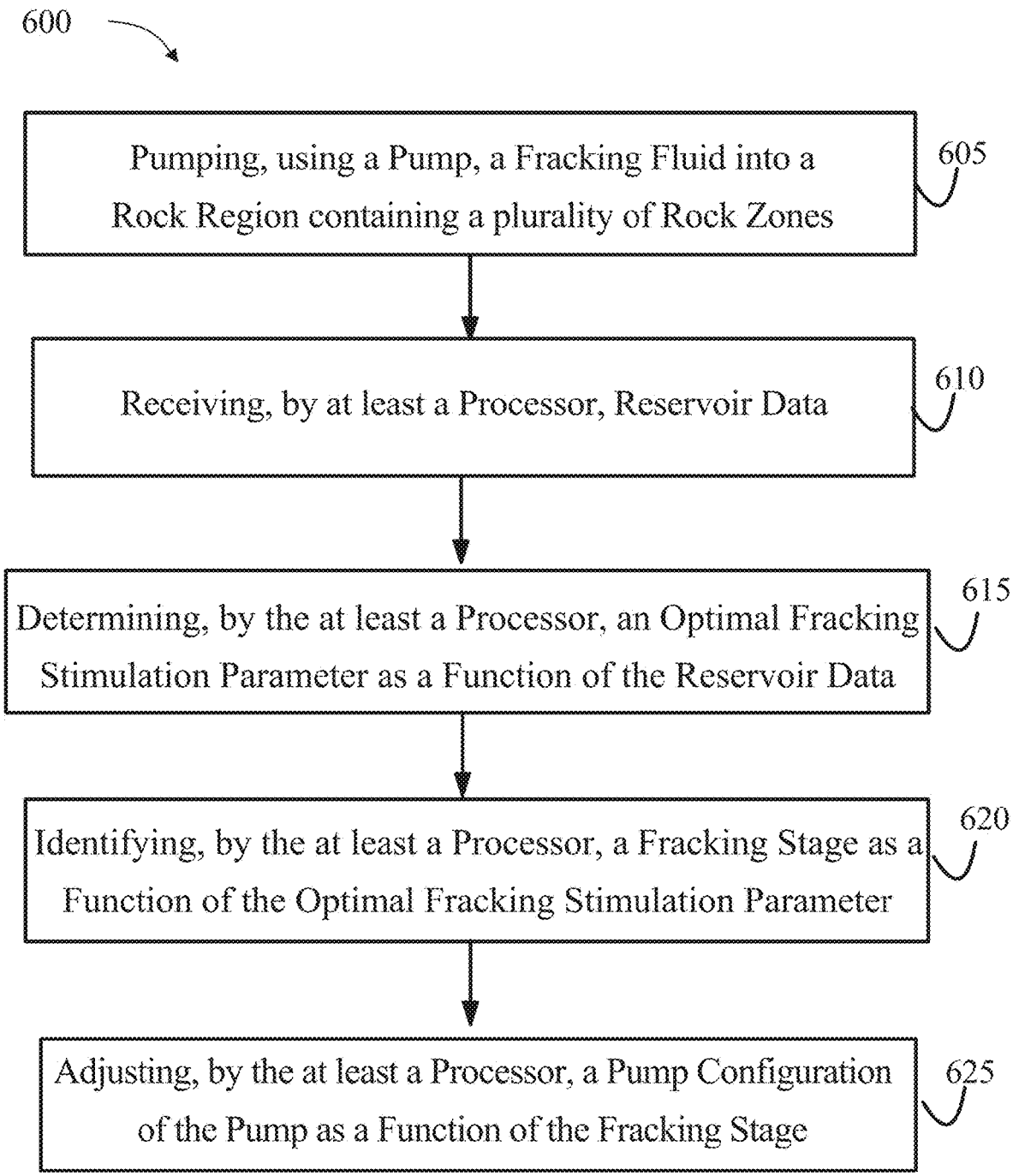
FIG. 6 is a flow diagram of an exemplary method for multi-stage fracking.

Referring now to FIG. 6, an exemplary method 600 for multi-stage fracking is shown. Method 600 includes a step 605 of pumping, using a pump, a fracking fluid into a rock region containing a plurality of rock zones, without limitation, as described above in reference to FIGS. 1-5. Pump may be any pump described in this disclosure. Fracking fluid may be any fluid described in this disclosure. In some embodiments, step 605 of pumping the fracking fluid may include creating a discrete fracture network in the rock region and isolating a previous rock region. In some embodiments, isolating the previous rock region may include a usage of mechanical isolation. This may be implemented, without limitation, as described above in reference to FIGS. 1-5.

With continued reference to FIG. 6, method 600 further includes a step 610 of receiving, by at least a processor, reservoir data, without limitation, as described above in reference to FIGS. 1-5. In some embodiments, reservoir data may include historical reservoir data. This may be implemented, without limitation, as described above in reference to FIGS. 1-5. In some embodiments, step 610 of receiving reservoir data may include generating a fracking training data as a function of the reservoir data and the optimal fracking stimulation parameter. This may be implemented, without limitation, as described above in reference to FIGS. 1-5.

With continued reference to FIG. 6, method 600 further includes a step 615 of determining, by the at least a processor, an optimal fracking stimulation parameter as a function of the reservoir data, without limitation, as described above in reference to FIGS. 1-5. In some embodiments, step 615 of determining the optimal fracking stimulation parameter may include modeling a fracking simulation model as a function of the reservoir data and determining the optimal fracking stimulation parameter as a function of the fracking simulation model. In some embodiments, generating the fracking training data may include converting the reservoir data and the optimal fracking stimulation parameter into a cleansed data format using a data conversion module, wherein the cleansed data format may include a cleansed reservoir data and a cleansed optimal fracking stimulation parameter. This may be implemented, without limitation, as described above in reference to FIGS.

1-5. In some embodiments, step 615 of determining the optimal fracking stimulation parameter may include training a fracking optimization machine-learning model using the fracking training data and determining the optimal fracking stimulation parameter as a function of the trained fracking optimization machine-learning model. This may be implemented, without limitation, as described above in reference to FIGS. 1-5.

With continued reference to FIG. 6, method 600 further includes a step 620 of identifying, by the at least a processor, a fracking stage as a function of the optimal fracking stimulation parameter, without limitation, as described above in reference to FIGS. 1-5. In some embodiments, identifying the fracking stage may include identifying the fracking stage as a function of the usage of mechanical isolation. This may be implemented, without limitation, as described above in reference to FIGS. 1-5.

With continued reference to FIG. 6, method 600 further includes a step 625 of adjusting, by the at least a processor, a pump configuration of the pump as a function of the fracking stage, without limitation, as described above in reference to FIGS. 1-5. In some embodiments, adjusting the pump configuration of the pump may include adjusting the pump configuration as a function of the optimal fracking stimulation parameter. In some embodiments, step 620 of adjusting the pump may include delivering a diverting agent into the rock region, wherein the diverting agent is configured to prevent the fracking fluid from entering the rock zone. This may be implemented, without limitation, as described above in reference to FIGS. 1-5.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
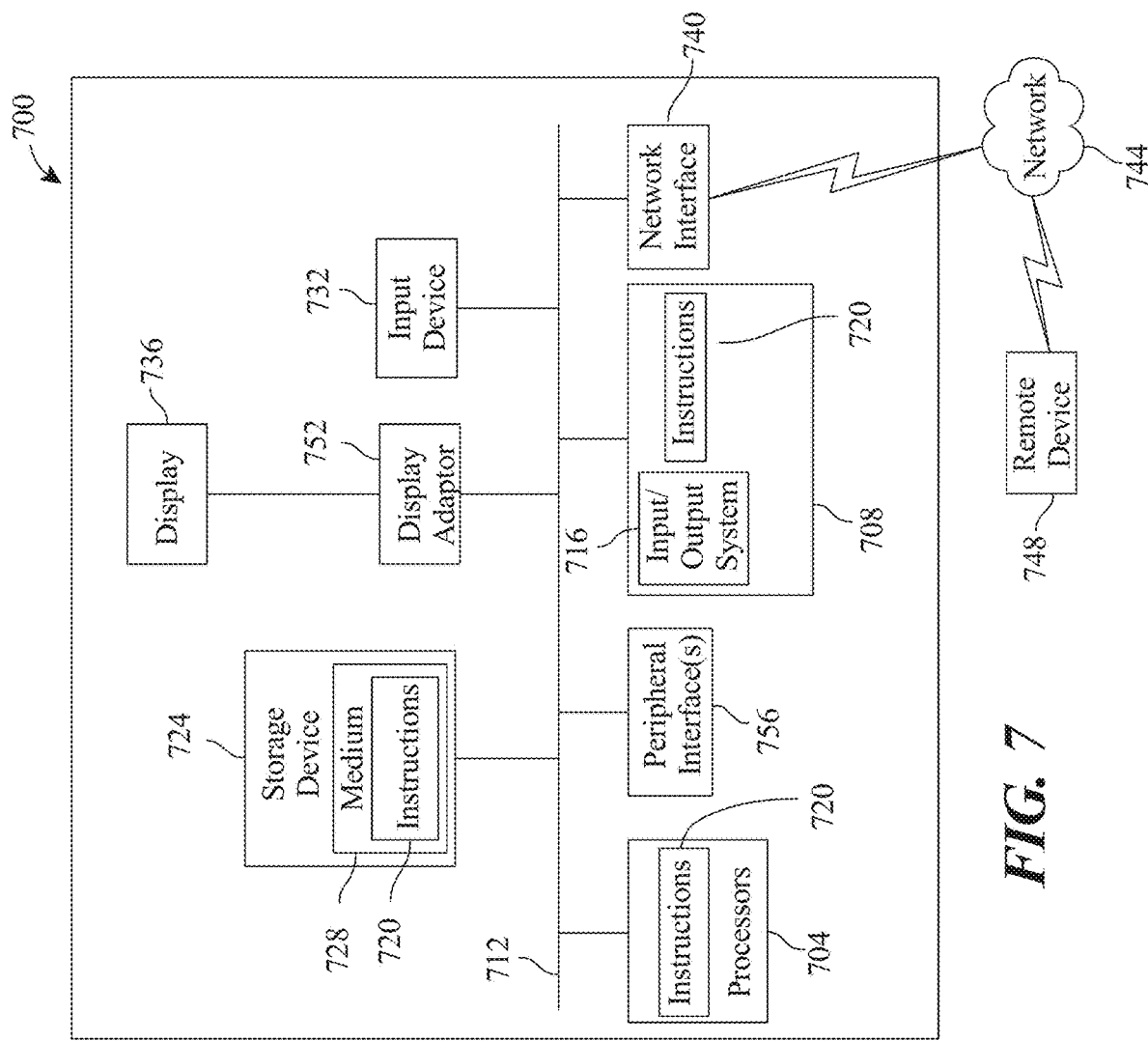
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIREWIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for multi-stage fracking, wherein the apparatus comprises:
   a pump comprising one or more valves, wherein the pump is configured to pump a fracking fluid into a rock region comprising a plurality discreate fracture networks on a pump configuration;
   a computing device communicatively connected to the pump, wherein the computing device comprises:
   at least a processor; and
   a memory communicatively connected to the at least a processor, wherein the memory contains instructions configuring the at least a processor to:
   receive a first set of reservoir data from a first set sensing devices located on a surface of a target well;
   determine an optimal fracking stimulation parameter as a function of the first set of reservoir data using a fracking optimization machine-learning model, wherein determining the optimal fracking stimulation parameter further comprises:
   generating a fracking simulation model as a function of a second set of reservoir data; and
   adjusting a pump horsepower as a function of the fracking simulation model;

identify a fracking stage as a function of the optimal fracking stimulation parameter;
adjust the pump configuration of the pump as a function of the fracking stage, wherein the one or more valves are actuated to control a release of the fracking fluid as a function of the pump configuration;
receive the second set of reservoir data using a second set of sensing devices based on the actuation of the one or more valves, wherein the second set of reservoir data is associated with an effect of actuation of the one or more valves on the rock region; and
update the optimal fracking stimulation parameter as a function of the second set of reservoir data.

2. The apparatus of claim 1, wherein determining the optimal fracking stimulation parameter comprises:
iteratively training a fracking optimization machine-learning model using fracking training data, wherein the fracking training data comprises the first set of reservoir data and the second set of reservoir data correlated to examples of optimal fracking stimulation parameters; and
determining the optimal fracking stimulation parameter using a trained fracking optimization machine-learning model.

3. The apparatus of claim 1, wherein the memory further instructs the processor to convert the reservoir data into a cleansed data format using a data conversion module.

4. The apparatus of claim 1, wherein the first set of reservoir data comprises a downhole condition associated with the rock region.

5. The apparatus of claim 1, wherein the second set of reservoir data comprises a fluid parameter associated with the rock region.

6. The apparatus of claim 1, wherein:
the second set of sensing devices further comprises at least a geophone located at the surface of the target well; and
the second set of reservoir data comprises a ground motion during fracking.

7. The apparatus of claim 1, wherein the first set sensing devices comprises a string of fiber optic sensors disposed along a well casing.

8. The apparatus of claim 1, wherein pumping the fracking fluid comprises:
creating a discrete fracture network in the rock region; and
isolating a previous rock region, wherein isolating the previous rock region comprises using mechanical isolation.

9. The apparatus of claim 8, wherein identifying the fracking stage comprises identifying the fracking stage as a function of the usage of mechanical isolation.

10. A method for multi-stage fracking, wherein the method comprises:
pumping, using a pump comprising one or more valves, a fracking fluid into a rock region comprising a plurality discreate fracture networks on a pump configuration;
receiving, using at least a processor, a first set of reservoir data from a first set sensing devices located on the surface of a target well;
determining, using the at least a processor, an optimal fracking stimulation parameter as a function of the first set of reservoir data using a fracking optimization machine-learning model, wherein determining the optimal fracking stimulation parameter further comprises:
generating a fracking simulation model as a function of a second set of reservoir data; and
adjusting a pump horsepower as a function of the fracking simulation model;
identifying, using the at least a processor, a fracking stage as a function of the optimal fracking stimulation parameter;
adjusting, using the at least a processor, the pump configuration of the pump as a function of the fracking stage, wherein the one or more valves are actuated to control a release of the fracking fluid as a function of the pump configuration;
receiving, using at least a processor, the second set of reservoir data using a second set of sensing devices based on the actuation of the one or more valves, wherein the second set of reservoir data is associated with effect of actuation of the one or more valves on the rock region; and
updating, using at least a processor, the optimal fracking stimulation parameter as a function of the second set of reservoir data.

11. The method of claim 10, wherein determining the optimal fracking stimulation parameter comprises:
iteratively training a fracking optimization machine-learning model using fracking training data, wherein the fracking training data comprises the first set of reservoir data and the second set of reservoir data correlated to examples of optimal fracking stimulation parameters; and
determining the optimal fracking stimulation parameter using a trained fracking optimization machine-learning model.

12. The method of claim 10, wherein the method further comprises converting, using the at least a processor, the reservoir data into a cleansed data format using a data conversion module.

13. The method of claim 10, wherein the first set of reservoir data comprises a downhole condition associated with the rock region.

14. The method of claim 10, wherein the second set of reservoir data comprises a fluid parameter associated with the rock region.

15. The method of claim 11, wherein:
the second set of sensing devices further comprises at least a geophone located at the surface of the target well; and
the second set of reservoir data comprises ground motion during fracking.

16. The method of claim 10, wherein the first set sensing devices comprises a string of fiber optic sensors disposed along a well casing.

17. The method of claim 10, wherein pumping the fracking fluid comprises:
creating a discrete fracture network in the rock region; and
isolating a previous rock region, wherein isolating the previous rock region comprises using mechanical isolation.

18. The method of claim 17, wherein identifying the fracking stage comprises identifying the fracking stage as a function of the usage of mechanical isolation.

* * * * *